United States Patent
Kersh, III et al.

[11] Patent Number: 5,278,802
[45] Date of Patent: Jan. 11, 1994

[54] DECODING GLOBAL DRIVE/BOOT SIGNALS USING LOCAL PREDECODERS

[75] Inventors: David V. Kersh, III, Houston; Jimmie D. Childers, Missouri City, both of Tex.

[73] Assignee: Texas Instruments Incorporated, Dallas, Tex.

[21] Appl. No.: 913

[22] Filed: Jan. 6, 1993

Related U.S. Application Data

[63] Continuation of Ser. No. 658,421, Feb. 20, 1991, abandoned, which is a continuation of Ser. No. 264,404, Oct. 28, 1988, abandoned.

[51] Int. Cl.[5] .................... G11C 8/00; G11C 5/02; G11C 5/06
[52] U.S. Cl. .................. 365/230.06; 365/51; 365/63; 307/449; 307/463
[58] Field of Search ............ 365/51, 63, 230.03, 365/230.06; 307/449, 463

[56] References Cited

U.S. PATENT DOCUMENTS

| | | | |
|---|---|---|---|
| 4,259,731 | 3/1981 | Moench | 365/230.06 |
| 4,455,629 | 6/1984 | Suzuki et al. | 365/230.06 |
| 4,514,829 | 4/1985 | Chao | 365/230.06 |
| 4,618,784 | 10/1986 | Chappell et al. | 365/230.06 |
| 4,660,174 | 4/1987 | Takemae et al. | 365/63 |
| 4,660,178 | 4/1987 | Hardee et al. | 365/230.06 |
| 4,678,941 | 7/1987 | Chao et al. | 365/230.06 |
| 4,791,615 | 12/1988 | Pelley, III et al. | 365/230.06 |
| 4,796,224 | 1/1989 | Kawai et al. | 365/63 |
| 4,849,943 | 7/1989 | Pfennings | 365/230.06 |

Primary Examiner—Glenn Gossage
Attorney, Agent, or Firm—Larry J. Bassuk; Rose K. Castro; Ronald O. Neerings

[57] ABSTRACT

A word or row line (38a, 38b) associated with at least one row of memory cells in an integrated circuit memory array (10) having a plurality of word lines is driven by a drive/boot generator signal (RLXH) by first generating this drive signal using a drive signal generator (20) that is formed in a peripheral area (14) of the chip (10). The drive signal (RLXH) is transmitted to each of a plurality of predecoders (40) that are formed within a memory cell array area (12) of the chip (10). At least one of the predecoders (40) is actuated to transmit the drive signal (RLXH) onto a selected one of a plurality of predecoder output lines (RDD0-RDD3) in response to predecoded addressing or row factor signals (RF0-RF19). The drive signal (RLXH) is transmitted on a selected predecoder output line (44) to each of a plurality of decoders (36) formed within the array area (12). At least one of the decoders (36) actuated to transmit the drive signal (RLXH) from the addressed predecoder output line (RDD0-RDD3) to at least a selected one of a plurality of word lines (38a, 38b) in response to predetermined ones of the addressing or "row factor" signals signals (RF0-RF19). The selected word lines (38a, 38b) are then driven and booted using the decoded drive/boot signal (RLXH).

3 Claims, 4 Drawing Sheets

DECODING GLOBAL DRIVE/BOOT SIGNALS USING LOCAL PREDECODERS

This application is a continuation of application Ser. No. 07/658,421, filed Feb. 20, 1991, now abandoned, which is a continuation of application Ser. No. 07/264,404, filed Oct. 28, 1988, also now abandoned.

TECHNICAL FIELD OF THE INVENTION

The present invention relates in general to dynamic random access memories, and more particularly to a method and apparatus for decoding addressing signals a drive signal and driving onto preselected word lines using predecoders.

BACKGROUND OF THE INVENTION

Industrial users of dynamic random access memories (DRAMs) are demanding ever-quicker timing and ever-smaller power specifications. To meet these specifications, designers must design DRAMs to read from and write to the DRAM storage cells more and more quickly while at the same time using less power. This requires that improved methods be discovered to drive DRAM word lines (also referred to as "row" lines in the art) to a voltage supply source Vdd during the precharge portion of the reading cycle and to boot them above $V_{dd}$ during the active restore portion of the cycle. These functions are a substantial part of an active cycle's length.

A selected word line is driven for reading, and is booted for the active restore function, using a drive/boot signal transmitted from a drive/boot signal generator conventionally located in a peripheral area of the chip. An increasing importance has been placed on the decoding path of this drive/boot signal from the drive/boot generator to the active word lines. If this decoding path is too resistive or capacitive, the driving and booting of the word lines will be too slow. In addition, if the drive/boot signal path is too capacitive, the device will use too much power.

To illustrate the disadvantages of present drive/boot signal decoding systems, two examples will be described. In a pair of conventional 64 K and 256 K DRAM designs, one drive/boot generator is provided. Its output is split into two separate global signal lines (that is, signal lines that extend over the entire array) using pass gates. Therefore, only one of the split lines is required to be active in any given cycle. Each of the split lines then connects to one-half of all of the word line drivers or decoders in the DRAM in order to drive and boot the appropriate word lines. The row decoders are selected by addressing signals. Thus, in any given cycle, the one master drive/boot signal will "see" the parasitic capacitance of one-half of all of the word line drivers on the entire chip connected to it, plus the parasitic capacitance of two extra decoding pass gates. In addition to the relatively large amount of capacitance that this creates, the drive/boot signal is required to travel through the resistance of one pass gate and one word line driver to get to each decoded word line.

According to another conventional design used in 256 K and 1 M Complementary Metal Oxide Semiconductor (CMOS) DRAMs, four drive/boot generators are provided with four separate global drive/boot signal lines. Only one of these signal lines is active for any given cycle. Each drive/boot signal line is directly connected to one-fourth of all of the word line drivers on the chip. The four generators used according to this method require more space on the chip than one large signal generator. Further, each of the four drive/boot signal lines is heavily loaded with one-fourth of the entire chip's word line drivers parasitic capacitance. Each drive/boot signal must furthermore travel through the resistance of one word line driver to reach each word line.

The above conventional drive/boot signal decoding solutions require that the drive/boot signal "see" an undesirably large amount of parasitic capacitance, thus slowing down cycle times. The importance of minimizing this capacitance increases with increasing cycle speed, smaller voltage differences and larger array sizes such as are mandated for the 4 M DRAM. A need has therefore arisen for a drive/boot signal decoding scheme that will result in improved parasitic capacitance characteristics.

SUMMARY OF THE INVENTION

One aspect of the invention comprises a decoding circuit for driving a word line associated with at least one row of memory cells in an integrated circuit array having a plurality of such word lines. An array area of the integrated circuit contains the word lines, while a peripheral area of the integrated circuit has formed therein a drive signal generator. A plurality of predecoders are formed in the array area and are coupled to the drive signal generator by a drive signal line for receiving the drive signal. Multiple decoders are also formed in the array area for each predecoder. One of a plurality of outputs of at least an addressed one of the predecoders is operable to transmit a predecoded drive signal to each of a selected number of decoders. An addressed one of the decoders is in turn operable to transmit a decoded drive signal to at least one of a plurality of word lines coupled thereto.

In a preferred embodiment, the peripheral area of the chip also has formed therein an addressing signal generator. Addressing signals are transmitted from the addressing signal generator to each of the predecoders and each of the decoders. Only addressed ones of the predecoders will pass the drive signal onto selected decoders, and only addressed ones of the selected decoders will pass the drive signal from the addressed predecoders onto one or more of the word lines. In a particularly preferred embodiment, the addressing signal generator, hereinafter referred to as "row factor signal generator", outputs a plurality of addressing signals, hereinafter referred to as "row factor signals" on respective addressing signal lines, hereinafter referred to as "row factor signal lines according to an external address received by the addressing signal generator. A first set of the row factor signals determine which of a plurality of predecoder output lines will carry the drive/boot signal. A second set of the row factor signals select which of the predecoders will be actuated to transfer the drive/boot signal to the a selected predecoder output line. Yet another set of the row factor signals selects at least one decoder for receiving the drive/boot signal on the selected predecoder output line, and for transmitting the drive/boot signal to the selected word line.

In another aspect of the invention, the apparatus used to decode the main drive signal onto preselected word lines also decodes a booting signal to the same word lines.

A principal advantage of the invention is the reduction of the number of word or row line decoders "seen"

by the main drive/boot signal. In a 4 M DRAM design according to the invention the parasitic capacitance of only 4/128 of the entire chip's word line drivers, plus the capacitance of an extra 128 predecoding pass gates, is seen by the main drive/boot signal. Each of the extra 128 predecoding pass gates is however about four times larger than each word line driver in order to make the word lines rise time approximately the same as the rise time if the earlier 256 K and 1 M CMOS method was used. It is therefore estimated that the parasitic capacitance on the drive/boot line according to the invention, in a given cycle, is approximately equivalent to only one-tenth of the entire chip's word line driver parasitic capacitance. This allows the word lines to be driven faster and at the same time to use less power in doing it.

BRIEF DESCRIPTION OF THE DRAWINGS

Further aspects of the invention and their advantages will be discerned by the following detailed description in conjunction with the drawings in which.

DETAILED DESCRIPTION OF THE INVENTION

Figure 1:
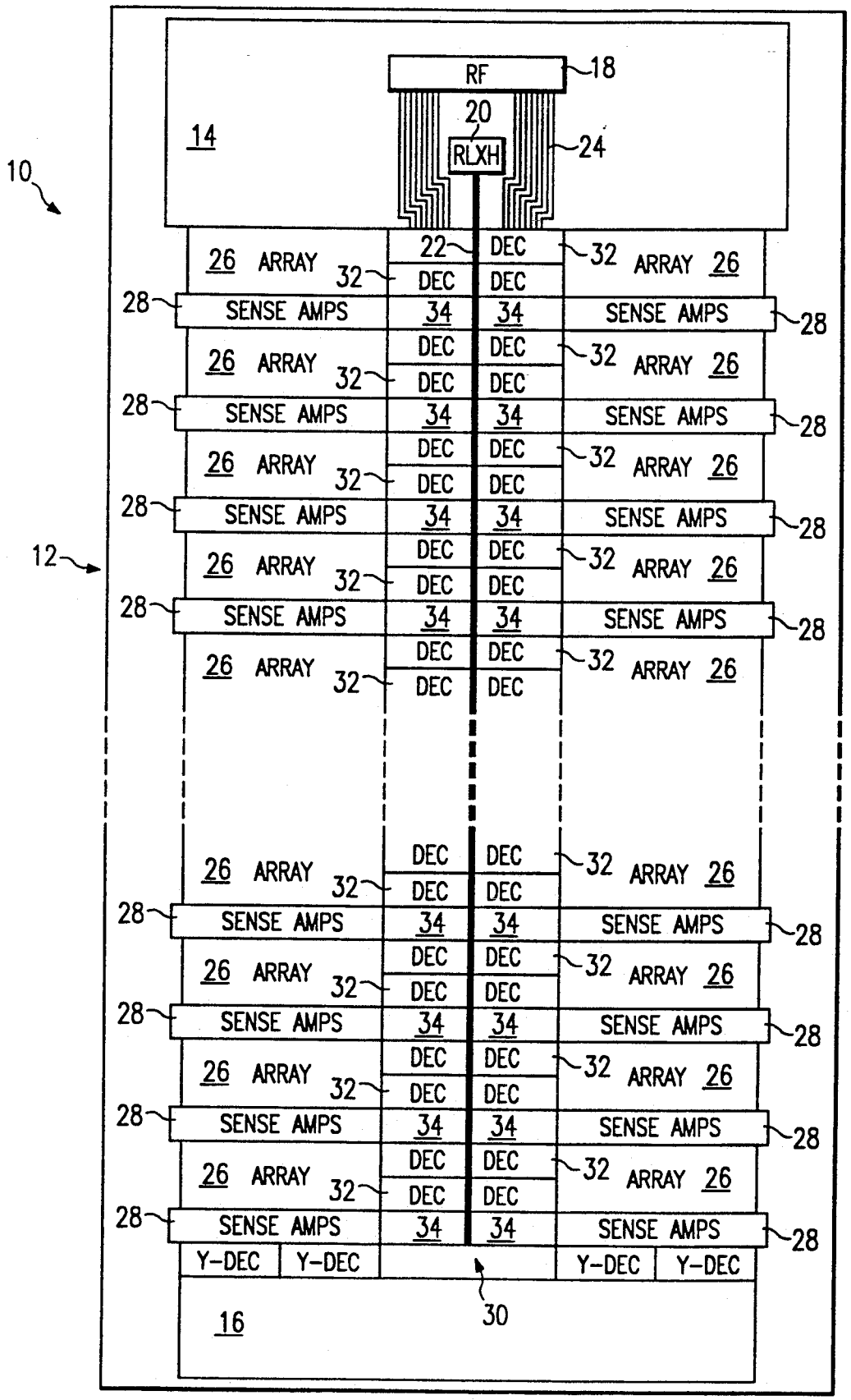
FIG. 1 is a partial schematic plan layout showing a four megabit DRAM design according to the invention.

Referring first to FIG. 1, a layout of a dynamic random access memory (DRAM) chip is shown generally at 10. The particular layout shown is for a four megabit DRAM. The chip 10 includes a cell array area indicated generally at 12, and a pair of end peripheral areas 14 and 16 adjacent the cell array area 12.

In the illustrated embodiment, a row factor signal generator 18 (RF) and a drive/boot signal generator 20 (RLXH) are formed in the peripheral area 14. The size and positioning of signal generators 18 and 20 are shown only schematically. The drive/boot signal generator 20 has an output that is connected to a drive/boot signal generator line 22 that runs down the middle of the array area 12. The row factor signal generator 18 has a plurality of row factor signal lines 24 (schematically illustrated; in one actual embodiment there are twenty such lines 24) that also run down the middle of the array area 12 so as to be substantially parallel to the drive/boot signal line 22.

The array area 12 contains a plurality of DRAM memory cell arrays 26 that are arranged in rows and columns. In the embodiment illustrated, there are thirty-two arrays 26 arranged in sixteen rows and two columns, each array having 128 K memory cells. Only the first five and the last four of the rows are shown, the remaining seven middle rows being similar in construction and indicated by dashed continuation lines. The arrays 26 are spaced from each other in a vertical or columnar direction by respective ones of a plurality of sense amplifiers 28 and in a row or horizontal direction by a vertical space indicated generally at 30.

The vertical space 30 is in part occupied by a plurality of row decoder sections 32. The layout of the arrays 26, sense amplifiers 28 and row decoder sections 32 leaves a plurality of "holes" 34 that are used to lay out the predecoders and row redundancy decoders described below. The drive/boot signal line 22 and the row factor signal lines 24 are preferably routed down the length of the chip within the vertical space 30.

Figure 2:
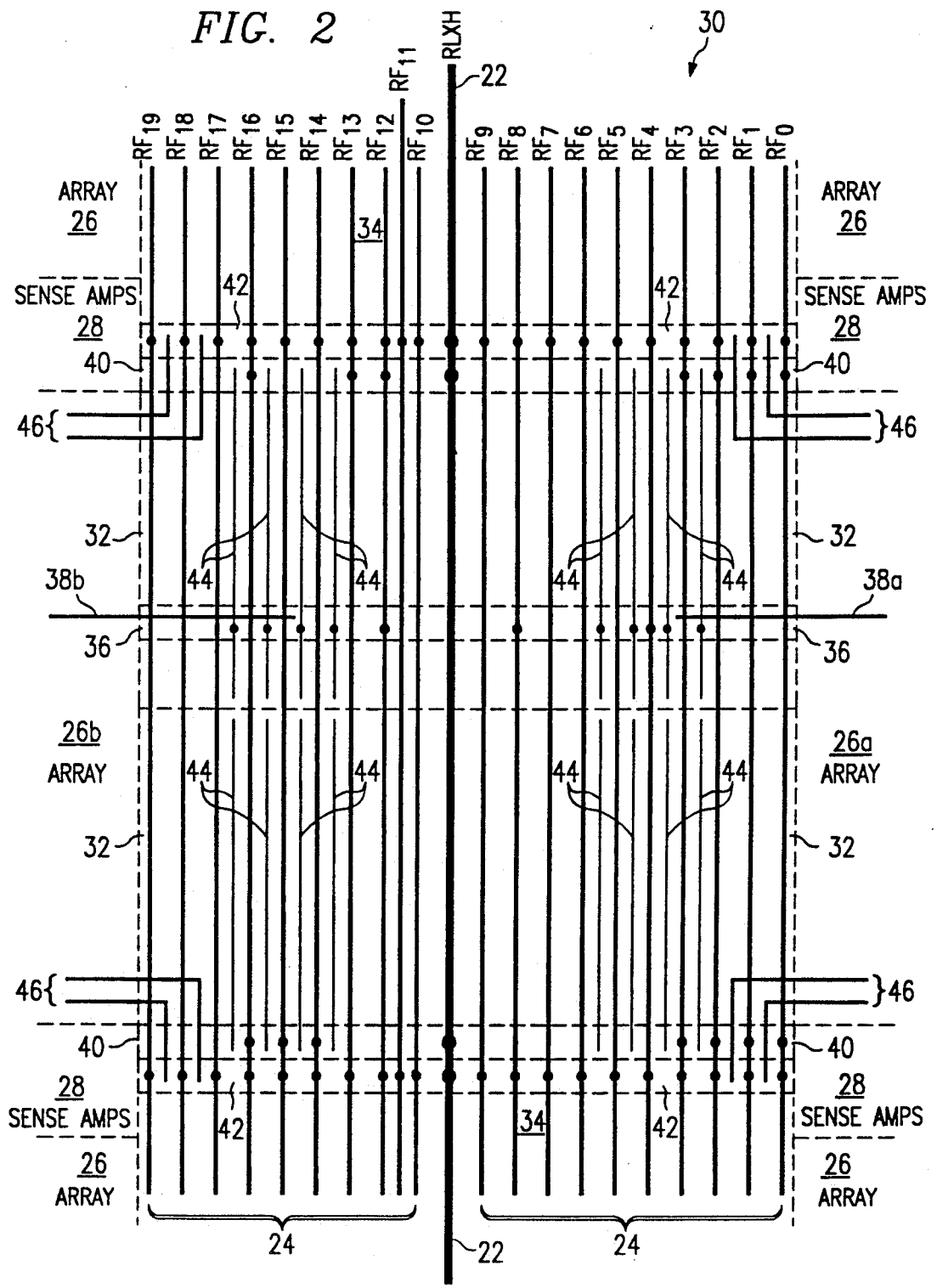
FIG. 2 is a simplified schematic electrical layout of a small portion of the DRAM illustrated in FIG. 1.

Turning now to FIG. 2, a small detail of the layout shown in FIG. 1 is illustrated. The areas devoted to laying out cell arrays 26, sense amplifiers 28, decoder sections 32, and the predecoders and row redundancy decoders described below are indicated by dashed lines. The row decoder sections 32 are preferably laid out in pairs back-to-back and extend across the vertical space 30 from one cell array 26a in the right column to the opposite cell array 26b in the left column. In the illustrated embodiment, there are thirty-two row decoders in each row decoder section 32, one such row decoder being indicated at 36, surrounded by a dashed enclosure. Each row decoder 36 is operable to decode the drive/boot signal line onto two of eight word lines, four of the word lines being disposed in the cell array 26a and the other four word lines being disposed in the cell array 26b. Two of these word lines are shown at 38a, 38b.

A predecoder 40 is preferably laid out to be adjacent a respective decoder section 32. Predecoders 40 are laid out to use at least some of the space provided by "holes" 34. Each decoder section 32 is further provided with a row redundancy decoder 42 that is preferably disposed in an area adjacent to a respective predecoder 40.

The drive/boot signal (RLXH) generator line 22 is constituted by a relatively wide conductor strap in second metal to minimize resistance and preferably runs down the middle of the vertical space 30. Line 22 is connected to each row redundancy decoder 42 and each predecoder 40 along the length of the chip, as shown schematically by the connection dots on line 22.

The row factor (RF) signal lines 24 are routed generally in parallel to the RLXH signal line 22. Each of the twenty row factor signal lines 24 are connected to each row redundancy decoder 42, but only selected ones of the row factor signal lines 24 are connected to any one of the predecoders 40 and the decoders 36. The row factor signal lines 24 are connected to a particular predecoder 40 or to a particular decoder 36 according to a decoding scheme described more particularly in conjunction with FIGS. 3 and 4.

A plurality of predecoder output lines 44 originate within the predecoder 40 and are disposed generally in parallel with the row factor signal lines 24. The predecoder output lines 44 are preferably formed in second metal where they are parallel to row factor lines 24, and in first metal when they run perpendicular thereto (not shown in this schematic representation). Each predecoder line 44 intersects and is connected with each decoder 36 in a respective decoder section 32. In the illustrated embodiment, there are four predecoder output lines 44 and the signals carried thereon are termed RDD0, RDD1, RDD2, and RDD3 (see FIG. 3).

In the illustrated embodiment, each row redundancy decoder 42 is operable to decode the drive/boot signal onto a selected two of four redundant word lines 46. Four redundant word lines 46 are provided to replace up to two pairs of regular row lines 38 as needed. The word redundancy scheme herein mentioned is more particularly described in co-pending application Ser. No. 07/265,105 filed Oct. 31, 1988, now abandoned in favor of continuation application Ser. No. 07/653,855, filed Feb. 8, 1991.

Figure 3:
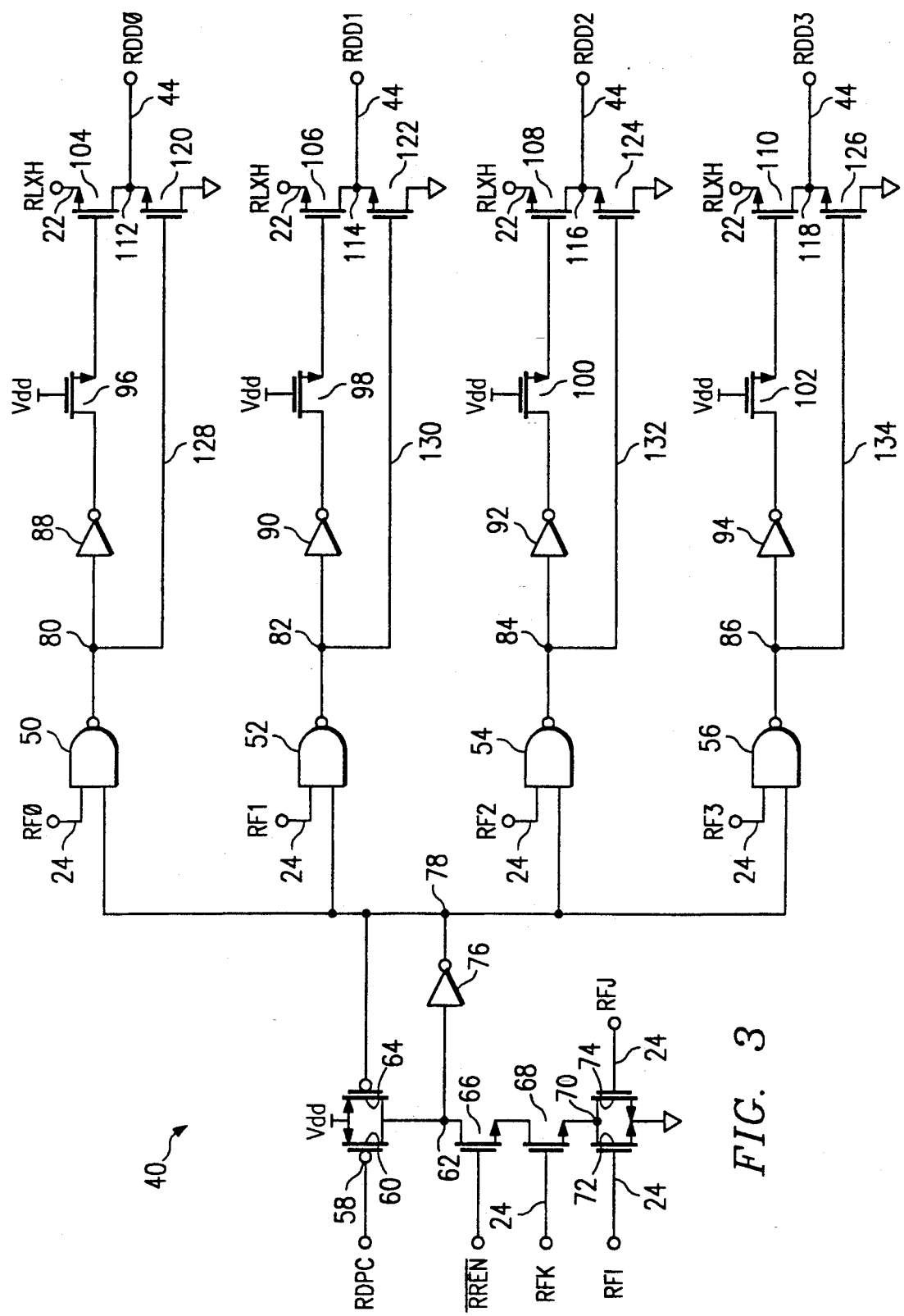
FIG. 3 is a detailed electrical schematic diagram of a single predecoder according to the invention.

Turning now to FIG. 3, there is illustrated a detailed electrical schematic diagram of one of the predecoders 40. A plurality of selected row factor signal lines 24 are connected as inputs to the predecoder circuit 40, and their identity varies according to a predetermined decoding scheme. Row factor signal lines RF0–RF3 are connected to respective inputs of four NAND gates 50, 52, 54 and 56. Row factor signal lines RF0–RF3 are connected to each predecoder circuit 40 on the chip. On the other hand, the identity of three other row factor signal input lines RFI, RFJ and RFK vary according to the particular predecoder circuit 40 to which they are connected. The table below gives the identity of RFI, RFJ and RFK according to the cardinal number of the particular predecoder 40.

TABLE I

| Predecoder No. | RFI | RFJ | RFK |
|---|---|---|---|
| 0, 8, 16, 24 | RF12 | RF13 | RF16 |
| 1, 9, 17, 25 | RF14 | RF15 | RF16 |
| 2, 10, 18, 26 | RF12 | RF13 | RF17 |
| 3, 11, 19, 27 | RF14 | RF15 | RF17 |
| 4, 12, 20, 28 | RF12 | RF13 | RF18 |
| 5, 13, 21, 29 | RF14 | RF15 | RF18 |
| 6, 14, 22, 30 | RF12 | RF13 | RF19 |
| 7, 15, 23, 31 | RF14 | RF15 | RF19 |

Seven row factor signal lines thus make connection to the inputs of each predecoder 40, while the remaining thirteen do not.

A predecoder signal output precharge signal RDPC is connected to a gate 58 of a P-channel transistor 60. The current path of transistor 60 selectively connects a voltage supply source ($V_{dd}$) to a node 62. The current path of another P-channel transistor 64 is also operable to connect $V_{dd}$ to the node 62.

The drain of an N-channel transistor 66 is connected to the node 62, while a source thereof is connected to the drain of a further N-channel transistor 68. The source of the N-channel transistor 68 is connected to a node 70, which in turn is connected to the drains of two N-channel transistors 72 and 74. The sources of N-channel transistors 72 and 74 are connected to ground or $V_{ss}$. The row factor signal line RFK is connected to the gate of transistor 68. The gate of transistor 72 is connected to signal line RFI, while the gate of transistor 74 is connected to signal line RFJ. The gate of transistor 66 is connected to a row redundancy enable signal line $\overline{RREN}$.

Node 62 serves as the input to an inverter 76. The output of inverter 76 is connected to a node 78, which in turn is connected back to the gate of the P-channel transistor 64. Node 78 is also connected to second inputs of NAND gates 50, 52, 54 and 56.

The outputs of NAND gates 50, 52, 54 and 56 are connected to respective nodes 80, 82, 84 and 86. Each node 80, 82, 84 and 86 is connected to an input of a respective inverter 88, 90, 92 and 94. The output of each inverter 88, 90, 92 and 94 is connected to the source of a respective large pass gate transistor 96, 98, 100 and 102. Each of the pass gate transistors 96, 98, 100 and 102 has a gate thereof connected to $V_{dd}$.

The drain of each pass gate transistor 96, 98, 100 and 102 is connected to the gate of a respective N-channel transistor 104, 106, 108 or 110. The sources of each of the transistors 104, 106, 108 and 110 are connected to the drive/boot signal line 22 (RLXH). The drains of transistors 104, 106, 108 and 110 are connected to respective nodes 112, 114, 116 and 118. Each node 112, 114, 116 and 118 is connected to the source of a respective grounding transistor 120, 122, 124 or 126. The drains of the grounding transistors 120, 122, 124 and 126 are connected to ground or $V_{ss}$. The gates of each transistor 120, 122, 124 and 126 are connected by respective lines 128, 130, 132 and 134 back to respective nodes 80, 82, 84 and 86. Each node 112, 114, 116 and 118 is connected to a respective predecoder output line RDD0–RDD3.

Figure 4:
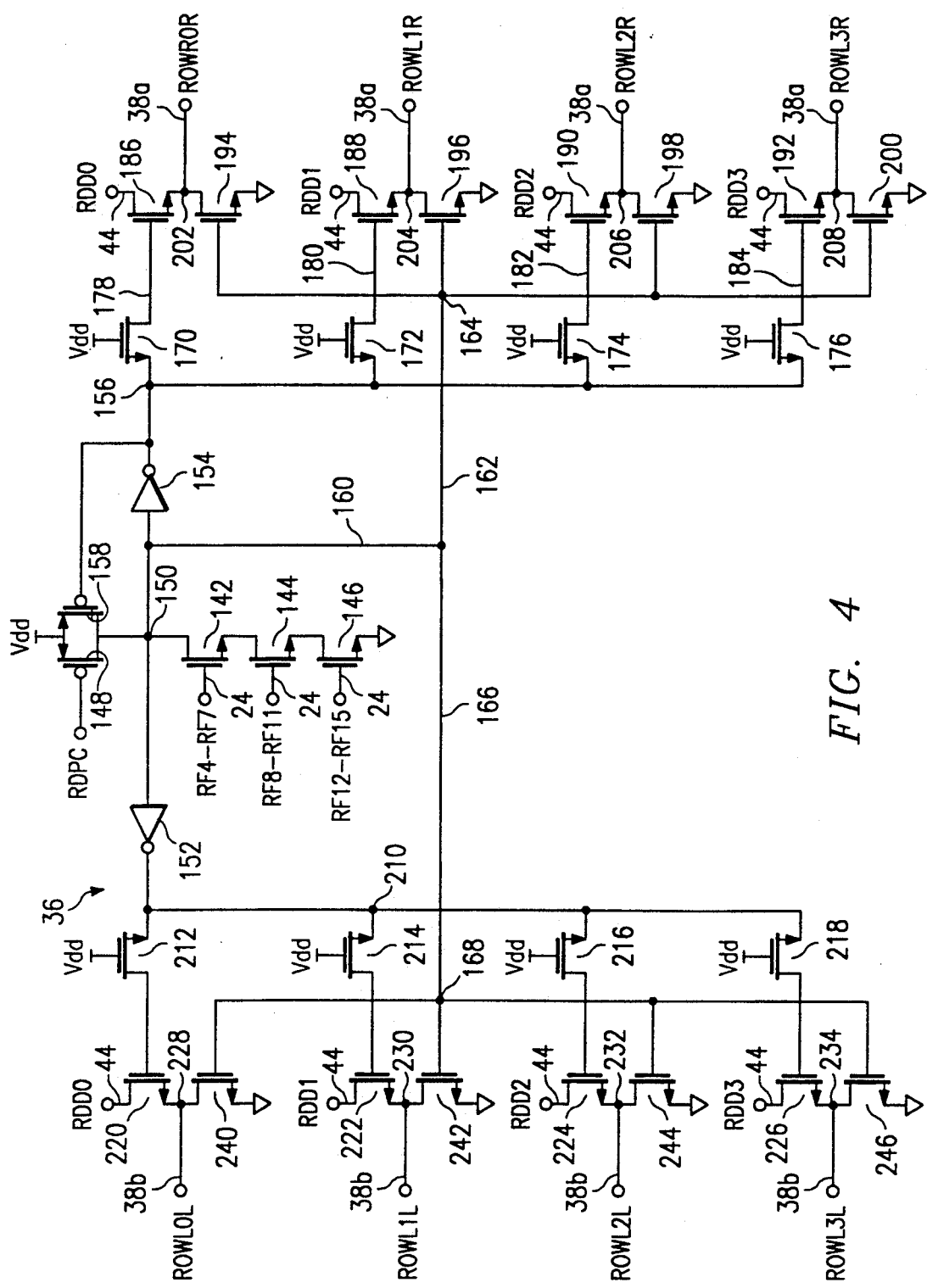
FIG. 4 is a detailed electrical schematic diagram of a single decoder according to the invention.

Turning next to FIG. 4, a detailed schematic diagram of one decoder circuit 36 is illustrated. Decoder circuit 36 is enabled by high states of three row factor signals appearing on the respective gates of enabling transistors 142, 144 and 146 in the center of FIG. 4. The row factor signal line 24 connected to the gate of transistor 142 is selected from one of RF4 through RF7. Similarly, the row factor signal line connected to the gate of transistor 144 is selected from RF8 through RF11, and the row factor signal line 24 that is connected to the gate of transistor 146 is selected from RF12 through RF15. The selection as to which of these lines is connected to the particular decoder circuit 36 varies according to the identity of the particular decoder circuit 36 within the decoder section 32 (FIG. 2). In this way, one out of the thirty-two decoders within any decoder section 32 can be selected.

A row decoder precharge signal line RDPC, which is the same as the predecoder precharge signal RDPC, is connected to the gate of a P-channel transistor 148. The current path of transistor 148 connects a voltage supply $V_{dd}$ to a node 150. Node 150 is connected to the inputs of left and right inverters 152 and 154. The output of inverter 154 is connected to a node 156, which is in turn connected back to the gate of a P-channel transistor 158. The current path of transistor 158 connects a $V_{dd}$ voltage supply to node 150. Node 150 is connected through lines 160 and 162 to a node 164, and is further connected through lines 160 and 166 to a node 168. Node 150 is selectively connected through the current paths of selecting transistors 142, 144 and 146 to $V_{ss}$ or ground.

Right inverter output node 156 is connected to the sources of each of four pass transistors 170, 172, 174 and 176. The drains of transistors 170, 172, 174 and 176 are in turn respectively connected to lines 178, 180, 182 and 184. Lines 178, 180, 182 and 184 are in turn connected to the gates of respective self-booting decoding transistors 186, 188, 190 and 192.

Node 164 is connected to the gate of each of four word line grounding transistors 194, 196, 198 and 200. Grounding transistors 194, 196, 198 and 200 are operable to connect respective word line nodes 202, 204, 206 and 208 to ground. Each word line node 202, 204, 206 and 208 is connected to a respective right array word line ROWL0R, ROWL1R, ROWL2R, or ROWL3R.

The decoding circuitry for the left array is similar to that for the right array. An output node 210 of left inverter 152 is connected to the source of each of a plurality of pass gate transistors 212, 214, 216 and 218. The drain of each of the pass gate transistors 212, 214, 216 and 218 is connected to a gate of a respective self-booting decoding transistor 220, 222, 224 or 226. The current path of each decoding transistor 220, 222, 224 and 226 connects a respective predecoder output line RDD0–RDD3 to a respective left array word line node 228, 230, 232 or 234. The left array word lines ROWL0L, ROWL1L, ROWL2L and ROWL3L are connected to the respective left array word line nodes 228, 230, 232 and 234.

The decoding of a drive/boot signal onto selected ones of the left and right word lines is as follows. Referring again to FIG. 1, a plurality of row factor signals are generated by the row factor signal generator 18 in the peripheral area 14. These travel by row factor signal lines 24 to selected decoders and predecoders on the chip 10. High row factor signal states will be generated on one of lines RF0-RF3, one of lines RF4-RF7, one of lines RF8-RF11, one of lines RF12-RF15, and one of lines from RF16-19. Turning now to FIG. 3 and as shown by Table I set out above, either RFI or RFJ of certain selected predecoder circuits 40 will be on so that either the gate of transistor 72 or the gate of transistor 74 will be turned on.

Turning back momentarily to FIG. 1, the architecture of the DRAM illustrated is divided into four quadrants, and the decoding scheme is such that one predecoder will be selected for each quadrant out of the the eight predecoders in the quadrant. A DRAM according to the invention could also be divided into halves, octants, or any other portions containing an integral quotient of the total number of predecoders.

With reference to FIG. 3, this means that for the selected predecoders, RFK and one RFI or RFJ will be in the high state, while the remaining seven of the eight predecoders in the quadrant will not have this enabling combination. The signal $\overline{RREN}$ must also be high to prevent the disabling of the entire predecoder. Finally, the precharge signal RDPC must go high to switch off P-channel transistor 58 so that node 62 can be pulled low. In each of the selected predecoders 40, the low state of node 62 will be inverted to a high state on node 78, which in turn will enable each of the NAND gates 50-56. Only one of the row factor signals RF0-RF3 will be high, while the rest will be low. Therefore, a selected one of the NAND gate output nodes 80-86 will be low, for example, node 82. The low state at node 82 will be inverted by inverter 90 to a high state at the drain of the transistor 98. Transistor 98 is operable to transfer this high state, minus a $V_t$ drop, to the gate of the respective decoding transistor 106.

Referring briefly back to FIG. 1, a drive signal RLXH will be sent down the drive/boot signal line 22 from the peripheral area 14 into the cell array area 12. Referring back to FIG. 3, the (in this example) turned-on decoding transistor 106 will self-boot its gate to above $V_{dd}+V_t$, as both node RLXH and node 114 rise, thus allowing a full $V_{dd}$ to appear at node 114, which in turn is output on the RDD1 predecoder output line.

Referring now to FIG. 4, RDD1 appears at the drains of both the left decoding transistor 222 and right decoding transistor 188. The RF signals sent down the length of the chip from the RF signal generator 18 (FIG. 1) will have selected one out of thirty-two decoders 36 in each decoding section 32 on the chip. The combination of selecting one out of eight predecoders 40 in each quadrant, one of the four predecoder output lines RDD0-RDD3 lines per predecoder 40, and one decoder 36 out of thirty-two decoder 36 (FIG. 2) per predecoder 40, means that only two word lines will be active per quadrant. In addition, the parasitic capacitance of only sixty-four decoding transistors of the thirty-two decoders 36 per quadrant is seen by the RLXH drive/boot signal, as the parasitic capacitance of the remaining one hundred and ninety-two decoding transistors of the thirty-two decoders 36 is masked by the nonselected parts of the selected predecoders 40, in other words, the three nonactive lines of predecoder output lines RDD0-RDD3. All of the parasitic capacitance of the other decoding transistors in the quadrant are masked from the RLXH drive/boot signal by the nonselected predecoders 40 in the quadrant.

A low state at the decoder selecting node 150 in a selected decoder 36 (FIG. 4) will be inverted by the inverters 152 and 154 and will therefore appear as high states at nodes 156 and 210. The high states at nodes 156 and 210 are passed through the transistors 170, 172, 174, 176, 212, 214, 216, and 218 to actuate the gates of right decoding transistors 186, 188, 190 and 192 and left decoding transistors 220, 222, 224 and 226. However, this results in a $V_t$ drop across transistors 170, 172, 174 and 176 and 212, 214, 216 and 218 as the gates of transistors 186, 188, 190 and 192 and 220, 222, 224 and 226 are charged to $V_{dd}-V_t$. The high state at the inverter output node 156 will also turn off the precharging transistor 158. The precharging transistor 148 will be turned off by a high state of RDPC.

In the case of the nonselected decoders 36, the state at node 150 will be high. This high state is communicated through lines 160, 162 and 166 to the gates of each of the right and left word line discharge transistors 194, 196, 198, 200, 240, 242, 244 and 246. Therefore, the right row line nodes 202, 204, 206 and 208 and the left row lines nodes 228, 230, 232 and 234 will stay discharged.

Assuming that node 150 is low, however, each of the current paths of transistors 186, 188, 190 and 192 and 220, 222, 224 and 226 will be actuated to transmit a high state appearing on any of the predecoder output lines RDD0-RDD3 to an appropriate set of right and left word lines. Carrying through the example that RDD1 is high and RDD0, RDD2, and RDD3 are low, the high RDD1 signal would be transmitted through the current path of transistors 188 and 222 to respective left and right word line nodes 230 and 204, which self-boot the gates of transistors 188 and 222 to at least $V_{dd}+V_t$, disallowing any $V_t$ drop across transistors 188 and 222. Right and left array row lines ROWL1R and ROWL1L would thereby be driven by the drive signal RLXH. This same current path established by the decoding of the predecoder circuit 40 (FIG. 3) and the decoder circuit 36 (FIG. 4) is used for the booting signal subsequently transmitted by the drive/boot generator to ROWL1R and ROWL1L during an active restore portion of the DRAM cycle.

In summary, a two-tier decoding scheme has been disclosed that prevents the drive/boot signal from "seeing" the parasitic capacitance of all but a small number of decoder circuits. Since the predecoder circuits are disposed locally on the chip, a global drive/boot signal line can be used without excessive power dissipation.

While a preferred embodiment and its advantages have been described in the above detailed description, the invention is not limited thereto but only by the spirit and scope of the appended claims.

What is claimed is:

1. A memory device having plural memory cells arranged in columns along word lines, and a row factor signal generator producing internal row factor signals in response to an external address, the row factor signals including a low order set of row factor signals, the device comprising:

A. a drive signal generator producing a drive signal on a drive signal line;
   B. plural decoders connected to the drive signal line and connected to receive selected ones of the row factor signals, every decoder being connected to the low order set of row factor signals and to at least one additional row factor signal, every predecoder having a set of predecoder output lines corresponding to the low order set of row factor signals, each output line carrying an output signal, at least one of the predecoders being selected in response to the at least one additional row factor signal to form an output signal by conducting the drive signal on an output line selected by the set of row factor signals; and C. plural decoders for each predecoder, every decoder being connected to receive certain of the row factor signals, and being connected to all of the output lines of its predecoder and to a set of right array and left array word lines corresponding to the set of predecoder output lines with one predecoder output line corresponding to one set of the right array and left array word lines, one of the decoders for each predecoder being selected by the certain row factor signals and, when selected, conducting the output signals on the predecoder output lines to the right array and left array word lines.

2. The device of claim 1 wherein the selected predecoder and decoder conduct the drive signal onto addressed word lines.

3. The device of claim 1 in which the device includes 32 predecoders arranged in quadrants of eight predecoders each, there are 32 decoders connected to each predecoder, and the row factor signals select one predecoder in each quadrant and one decoder for each predecoder.

* * * * *

UNITED STATES PATENT AND TRADEMARK OFFICE
CERTIFICATE OF CORRECTION

PATENT NO. : 5,278,802
DATED : January 11, 1994
INVENTOR(S) : David V. Kersh, III and Jimmie D. Childers It is certified that error appears in the above-indentified patent and that said Letters Patent is hereby corrected as shown below:

Column 8, line 64, change "plural decoders" to --plural predecoders--.

Column 8, line 66, change "every decoder" to --every predecoder--.

Signed and Sealed this

Fifth Day of March, 1996

Attest:

BRUCE LEHMAN

Attesting Officer

Commissioner of Patents and Trademarks